United States Patent [19]

Chung

[11] Patent Number: 4,910,800
[45] Date of Patent: Mar. 20, 1990

[54] DUAL BRANCH RECEIVER WITH WOBBLED OSCILLATOR FOR DISTORTION REDUCTION

[75] Inventor: Kah-Seng Chung, Bull Creek, Australia

[73] Assignee: U.S. Philips Corporation, New York, N.Y.

[21] Appl. No.: 240,983

[22] Filed: Sep. 6, 1988

[30] Foreign Application Priority Data

Sep. 3, 1987 [EP] European Pat. Off. .......... 87201666

[51] Int. Cl.⁴ ............................................. H04B 1/26
[52] U.S. Cl. .................................... 455/316; 455/315; 455/303; 455/304; 455/209
[58] Field of Search ............... 455/209, 315, 316, 337, 455/214, 137, 138, 303–305, 254, 258, 259, 264, 265

[56] References Cited

U.S. PATENT DOCUMENTS

| | | | |
|---|---|---|---|
| 3,624,507 | 11/1971 | Fukata | 455/68 |
| 4,313,219 | 1/1982 | Gabler et al. | 455/260 |
| 4,580,101 | 4/1986 | Lax | 455/214 |
| 4,633,315 | 12/1986 | Kasperkovitz | 455/265 |
| 4,682,117 | 7/1987 | Gibson | 455/214 |
| 4,736,390 | 4/1988 | Ward et al. | 455/324 |

*Primary Examiner*—Benedict V. Safourek
*Assistant Examiner*—Ralph Smith
*Attorney, Agent, or Firm*—David R. Treacy

[57] ABSTRACT

A dual branch receiver in which the frequency of the first local oscillator (32) is offset by a few hundred hertz from the input carrier in order to provide separate wanted and image components. Gain and phase control are provided to compensate for differences between the two branches (12, 14), the image signal being used to provide the required error signals. However in the event of the modulation frequency being equal to the offset frequency, the image signals cannot be distinguished from the wanted signals thus inhibiting gain and phase control. This drawback is overcome in the receiver in accordance with the present invention by wobbling the frequency provided by the first local oscillator (28). The wobbling frequency is preferably sub-audible so as not to be discernable to the ear.

18 Claims, 4 Drawing Sheets

DUAL BRANCH RECEIVER WITH WOBBLED OSCILLATOR FOR DISTORTION REDUCTION

BACKGROUND OF THE INVENTION

The present invention relates to a dual branch receiver.

Dual branch receivers well known. One example is described in U.S. Pat. No. 4633315. The interest in dual branch receivers stems primarily from the desire to manufacture as much as possible of a radio receiver as an integrated circuit. A problem in making a receiver circuit by integration is the construction of the filter circuits because it has been long recognised that it is not easy to build a band-pass filter whose pass-band is very narrow. N. F. Barber in an article "Narrow Band-Pass Filter Using Modulation" Wireless Engineer, May 1947 pages 132 to 134 discloses a filter in which an incoming signal is supplied to two branches each including three stages constituted by (1) a modulator for frequency down-converting the incoming signal, (2) a low pass filter for passing the difference component of the modulation and (3) another modulator for frequency up-converting the low pass filtered signal. The modulators in the two branches of the first and third stages are quadrature related with respect to each other. The outputs of the modulators in the third stages are recombined to provide a narrow band-pass filtered signal. Barber discusses the effects of errors resulting from the phase splitting and the differences in gains in the two branches. In the case of using this type of filter in an FM receiver in which after the first stage the modulation is folded about zero frequency, mismatching of gain and deviation from orthogonality between the two signal branches can give rise to an unwanted image being generated. This will result in distortion, and possibly a whistling tone, in the demodulated audio output.

FIG. 1 of U.S. Pat. No. 4633315 shows a dual branch receiver for television signals, comprising first and second branches I and Q, respectively, constituted by first and third mixers and second and fourth mixers. A signal input terminal is coupled to the first and second mixers, each of which also receives a respective one of the in-phase and quadrature phase outputs of an r.f. local oscillator. The r.f. oscillator frequency ($fl_1$) is offset by fo from the input carrier frequency (fc), fo having a value of the order of 100 to 200 Hz. The input signal is mixed down to a baseband, is low pass filtered and in the third and fourth mixers is frequency up-converted using the quadrature related outputs of a second intermediate frequency local oscillator. The in-phase and quadrature-phase signals in the first and second branches are applied to a scanning circuit and a differencing circuit by which the video and sound signals can be obtained.

In U.S. Pat. No. 4633315 gain and phase control are provided to correct for the imbalances between the two paths. Error signals for use in the control are derived from deviations in amplitude and phase of the unwanted image components at the outputs of the summing and differencing circuits. The particular embodiment disclosed in FIG. 1 of the patent uses the picture (or video) carrier signal V as a reference. This carrier signal is applied to a narrowband phase locked loop (PLL) which produces as detected carriers an in-phase carrier and a 90° out-of-phase carrier. These two detection carriers are applied to respective synchronous demodulators which also receive the output $\bar{V}$ of the difference circuit. The outputs of the synchronous demodulators are low pass filtered to provide d.c. voltages. The d.c. voltage derived using the in-phase carrier from the PLL is applied to an amplitude control circuit which controls the mixing gain of the fourth mixer by amplifying the oscillator mixing signal applied thereto. The d.c. voltage derived using the 90° out-of-phase PLL signal is used to effect phase control by varying the phase quadrature relationship between the two second (I.F.) oscillator mixing signals.

Introducing the small offset frequency fo between the first, r.f., local oscillator frequency $fl_1$ and the input carrier frequency fc enables separation of the unwanted image signal Du to be separated from the desired signal Dw. FIG. 1 of the accompanying drawings shows the signal components at the outputs of the differencing circuit, that is I-Q, assuming that the transmitted carrier fc is unmodulated. In this drawing, the wanted signal component Dw is located at the frequency $fl_2+fo$, where $fl_2$ is the frequency of the second local oscillator, while the unwanted image component Du is at $fl_2-fo$. The wanted and unwanted components can be easily distinguished.

The situation at the output of the differencing circuit becomes more complex if the transmitted carrier is frequency modulated. When modulating the signal there are more signal components at the harmonics of the modulating frequency, and their levels are governed by the modulation index employed. A problem arises however if the modulation frequency fm and the offset frequency fo become equal because the harmonics of fm in the wanted signal component Dw will fall on top of the image component Du. As a result it is impossible to detect the image component Du independently of the wanted component Dw in the output of the differencing circuit. If this occurs, the compensation schemes for the deviations in gain and phase between the I and Q branches, for example as described in U.S. patent specification 4633315, will cease to function correctly because they depend on the unwanted image component Du to provide the necessary error signal. Consequently the demodulated output from the receiver will suffer from distortions.

SUMMARY OF THE INVENTION

An object of the present invention is to avoid distortions in the receiver output.

According to the present invention, in a dual branch receiver comprising a signal input terminal coupled to first and second branches, the first branch including first and third mixers, the second branch including second and fourth mixers; a first local oscillator for producing a first local oscillator signal which is supplied to the first and second mixers for frequency down-converting an incoming signal applied to the input terminal, the first local oscillator frequency being offset from the carrier frequency of the incoming signal; a first 90° phase shifter for providing a quadrature phase relationship between one of the signals applied to one of the first and second mixers and the corresponding signal applied to the other of the second and first mixers; a second local oscillator for producing a second local oscillator signal which is applied in quadrature to the third and fourth mixers for frequency up-converting the quadrature related signals produced by the first and second mixers; and a summing circuit and a differencing circuit each having inputs coupled to outputs of the third output distortion is reduced by including fourth mixers, and means for frequency modulating the first local oscillator signal with a wobbling frequency which is less than the offset frequency.

The present invention is based on recognition of the fact that by wobbling the first local oscillator frequency, apart from two instants in time per period of the wobbling signal when the amplitude of the wobbling signal becomes zero, the error signal components Du are separated from Dw by a frequency margin of $(2|fo-fw|)$, and can thus be detected independently from the output of the differencing circuit.

The wobbling frequency fw is low and may be of the order of say 100 Hz. Such a small variation of the offset frequency has an advantage over a large variation of the offset frequency, because there is no need to provide a significant extension in the bandwidth of low pass selectivity filters in the output circuits of the first and second mixers. The wobbling frequency may be produced by a sinusoidal signal, a triangular signal or a ramping signal.

In an embodiment of the present invention the first local oscillator is a voltage controlled oscillator having a frequency control input. The frequency modulating means includes means for applying a wobbling signal voltage to a d.c. frequency control voltage applied to the frequency control input of the voltage controlled oscillator.

If desired the receiver may include automatic gain control means and automatic phase control means for compensating for gain and phase differences resulting from transmission differences in the first and second branches.

The present invention will be explained and described, by way of example, with reference to the accompanying drawing.

DESCRIPTION OF THE PREFERRED EMBODIMENT

Figure 1:
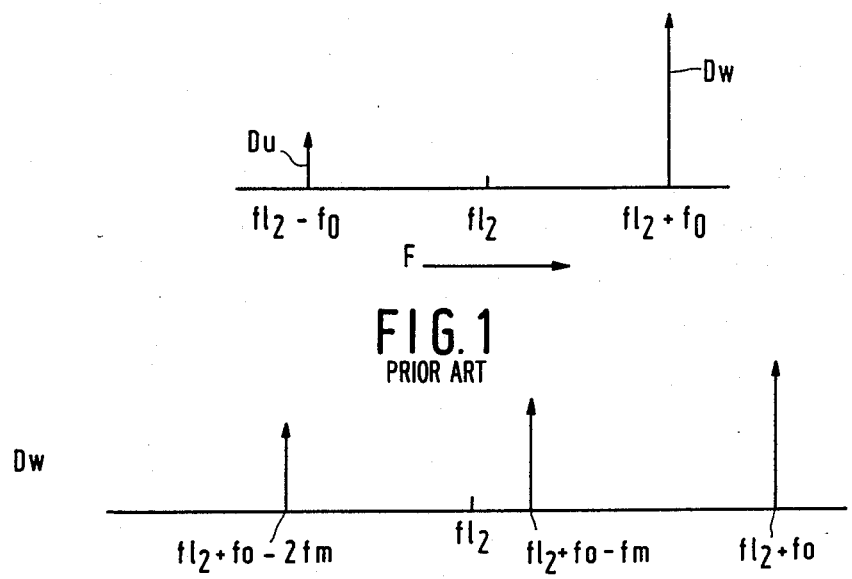
FIG. 1 illustrates the signal components in the output of a differencing circuit of a receiver not having wobbling of the first local oscillator frequency and the incoming carrier being unmodulated.

In the drawings corresponding reference numerals have been used to indicate similar features.

Figure 4:
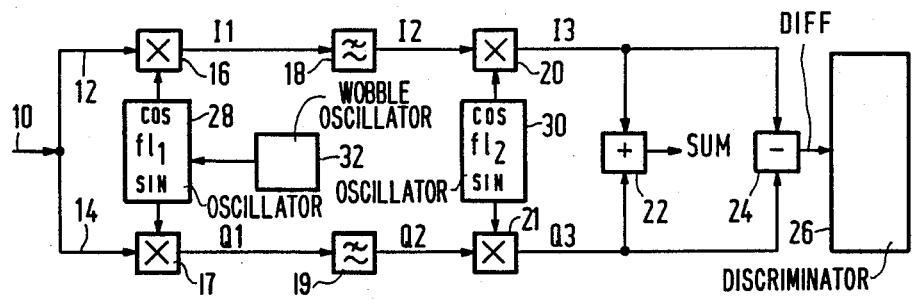
FIG. 4 is a block schematic circuit diagram of a receiver in accordance with the present invention.

Referring initially to FIG. 4 the dual branch receiver comprises first and second branches 12, 14 which are connected to an input terminal 10. The first branch 12 comprises a first mixer 16 in which the input signal is frequency down-converted, a low pass filter 18 which selects the down-converted component in the output from the first mixer 16 and a third mixer 20 in which the output signal from the filter 18 is remodulated or frequency up-converted. The second branch 14 comprises a second mixer 17 which produces a quadrature related frequency down-converted signal, a low pass filter 19 which selects the down-converted component in the output from the second mixer 17 and a fourth mixer 21 which produces a quadrature related frequency up-converted signal. The signal branch 12 is termed the in-phase branch I and the signals at the outputs of circuit elements 16, 18 and 20 are referenced I1, I2 and I3, respectively. The signal branch 14 is termed the quadrature phase branch Q and the signals at the outputs of circuit elements 17, 19 and 21 are referenced Q1, Q2 and Q3, respectively. The signals I3 and Q3 are applied to summing and differencing circuits 22, 24, respectively, which provide SUM and DIFF signals. A frequency discriminator 26 is connected to the output of the circuit 24 to produce for example an audio output.

The first and second mixers 16, 17 are provided with quadrature related first local oscillator signals $fl_1$ which are offset slightly, say by 100 Hz, relative to the carrier frequency fc of the input signal by a first local oscillator 28. It is of course possible to shift the input signal in the branch 14 by 90° and supply local oscillator signals of the same phase to both mixers 16, 17. A second local oscillator 30 produces quadrature related second local oscillator signals $fl_2$ at an intermediate frequency of say 100 kHz which are applied to the third and fourth mixers 20, 21.

A source 32 of wobbling signals is connected to the local oscillator 28 to frequency modulate the local oscillator signals. The wobbling frequency in this example is nominally 20 Hz and has a maximum deviation of 100 Hz. The deviation is controlled by the peak amplitude Aw of the wobbling signal. A low wobbling frequency is selected so that the bandwidth of the low pass filters 18, 19 remains substantially unchanged or is not significantly extended. The wobbling signal can be a sinusoidal signal, a triangular signal or a ramping signal.

In order to understand the reason for wobbling the first local oscillator frequency, initially situations will be described in which there is no wobbling of the frequency $fl_1$.

The situation which happens when there is no modulation of the carrier frequency has been described already with reference to FIG. 1 and accordingly in the interests of brevity the description will not be repeated.

Figure 2:
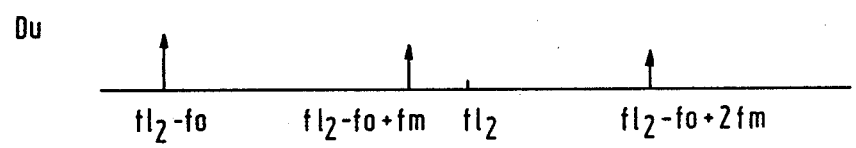
FIGS. 2 and 3 illustrate respectively signal components at the output of the differencing circuit in the presence of modulation with a single sinusoidal frequency fm, where fm<fo (FIG. 2) and fm=fo (FIG. 3)
Figure 2:
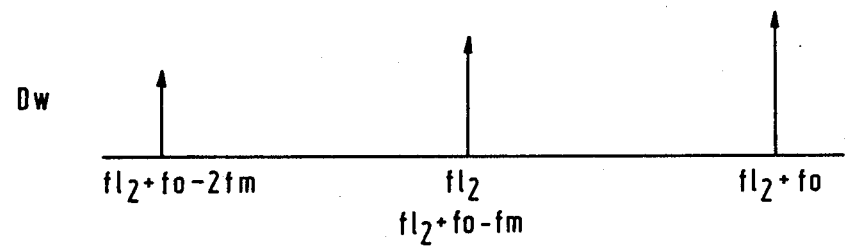

FIG. 2 extends the discussion of FIG. 1 by considering the situation at the output of the differencing circuit 24 when the transmitted carrier is frequency modulated by a sinusoidal signal of frequency fm, fm being less than the offset fo, such that the input signal rt is $$rt = A \sin (2\pi fct + \beta \sin (2\pi fmt))$$

where A is the peak amplitude of the received signal and $\beta$ is the modulation index.

The resultant signal components at the output of the differencing circuit 24, in the presence of deviations in gain and phase in the branches 12, 14, can be represented in the frequency domain shown in FIG. 2. Because of the modulation, there are more signal components at the harmonics of the modulating frequency fm, and their levels, indicated by the relative heights of the arrows in FIG. 2, are governed by the modulation index β employed. For ease of illustration, only three harmonic components are shown in FIG. 2 for the desired signal Dw and the unwanted image Du. It is evident from an examination of FIG. 2 that as long as the modulating frequency fm differs from the offset frequency fo, the Dw and Du signals will be separated by a frequency margin of $(2|fo-fm|)$ and in consequence can be separately distinguished.

Figure 3:
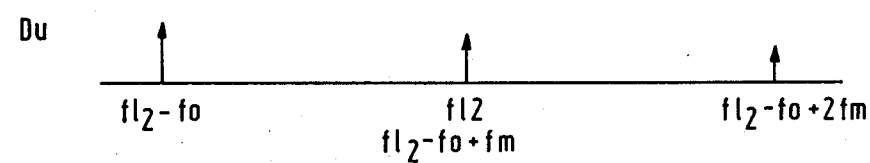

FIG. 3 illustrates the situation when fm=fo. Harmonics of fm in Dw will coincide in the frequency domain with the image Du. As a result, it is impossible to detect the image Du independently of the signal Dw from the DIFF output shown in FIG. 3. If this occurs, the compensation schemes for the deviations in gain and phase between the I and Q channels (or the branches 12, 14) as described in U.S. Pat. No. 4633315, or later herein with respect to FIG. 8 of the accompanying drawing will cease to function correctly because they depend on the image Du to provide the necessary error signal. Consequently, the demodulated audio output will suffer from severe distortions, which are unacceptable.

In the receiver made in accordance with the present invention, the image Du is made separable from Dw for substantially all modulating frequencies fm by continuously varying the offset frequency fo. This is achieved by wobbling the first local oscillator frequency $fl_1$ as described already with reference to FIG. 4.

Figure 5:
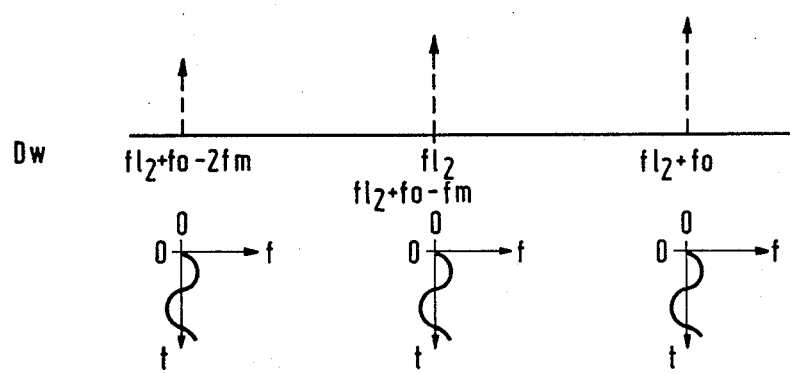
FIG. 5 illustrates the relationship in the frequency plane between the desirable and image signal components, Dw and Du, respectively, when the offset frequency is varying and the modulation (fm) substantially equals the nominal offset frequency, fo.
Figure 5:
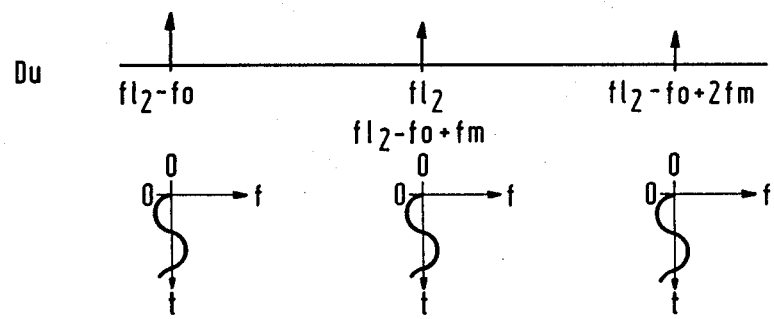

FIG. 5 illustrates the relationship in the frequency domain between Dw and Du for the case shown in FIG. 3 but with wobbling of the offset frequency fo.

From FIG. 5 it can be observed that because $fl_1$ is changing its frequency at a rate governed by fw, then the Du components are only completely coincident with the Dw components at two instants in time per period of the wobbling signal, i.e. when the amplitude Aw of the wobbling signal becomes zero. At other instants in time, the error signal components Du are separated from Dw by a frequency margin of $(2|fo-fw|)$, and can thus be detected independently from the DIFF output. By a proper choice of the wobbling signal, and the time constants of the correcting loops described with reference to FIG. 8, it is possible to minimize the number of instants that Du is "drowned" by Dw which is normally much larger in amplitude.

Figure 6:
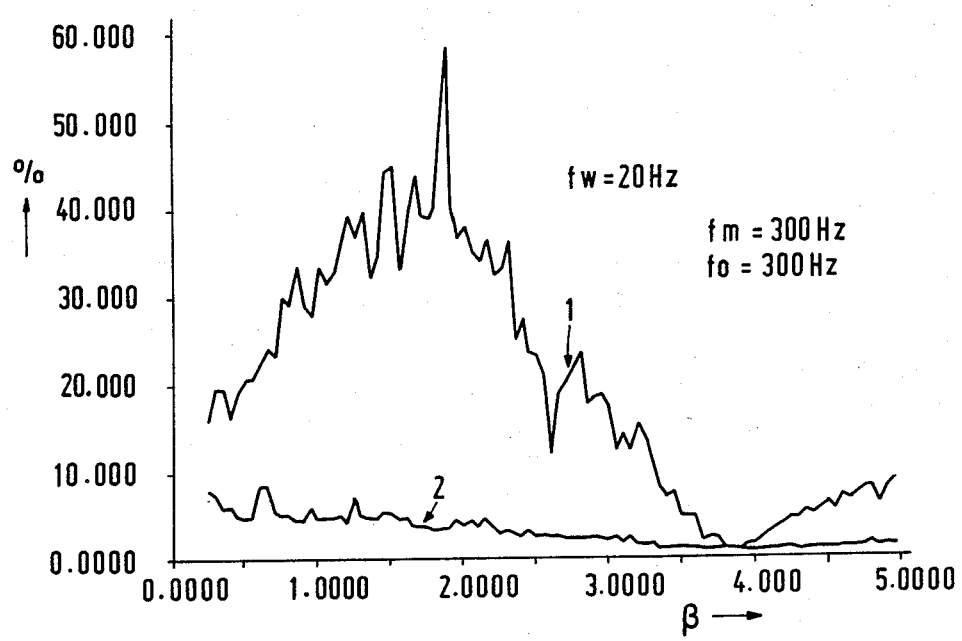
FIGS. 6 and 7 are comparative curves of distortion versus the modulation index, $\beta$, for audio frequencies of 300 and 800 Hz and without and with frequency wobbling.
Figure 7:
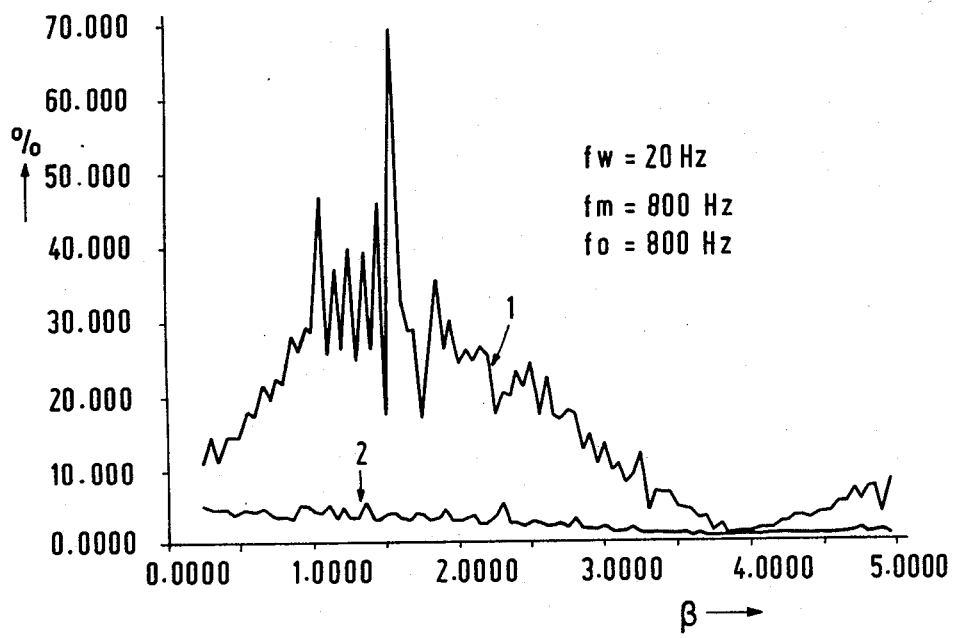

In one embodiment $fl_1$ is frequency modulated by a wobbling signal of frequency fw of 20 Hz, with a maximum frequency deviation of 100 Hz. The nominal offset frequencies fo adopted are 300 Hz and 800 Hz, and the corresponding modulating frequencies fm are 300 Hz and 800 Hz, respectively. In both cases, the frequencies of the modulating sinusoidal signal are made equal to the nominal offset frequencies. The measured distortions in percent expressed as a function of the modulation indices β are shown in FIGS. 6 and 7. In the experiments when the offset frequency fo remains fixed, severe distortions occur in the demodulated audio output curves (1). However, when the local oscillator frequency is wobbled at the output frequency fo distortions have greatly been reduced, curves (2).

The wobbling signal used need not be restricted to a sinusoidal waveform but it could be any convenient signal which would not cause a significant extension in bandwidth of the two low pass selectivity filters 18, 19 (FIG. 4). Also the additional wobbling signal will give rise to a demodulated output, and this has to be filtered out at the output of the frequency discriminator 26 (FIG. 4). In the above example, fw is chosen to be 20 Hz, so that it can be filtered out by the bandpass filter normally employed after the discriminator. This filter is needed for filtering the normal audio signal, which for mobile radio has a lower cutoff frequency of 300 Hz. In this case, no additional filtering is needed to remove the demodulated signal term caused by the wobbling signal.

Although only the DIFF output has been referred to in the above description, the same happens with the SUM output of FIG. 4.

Figure 8:
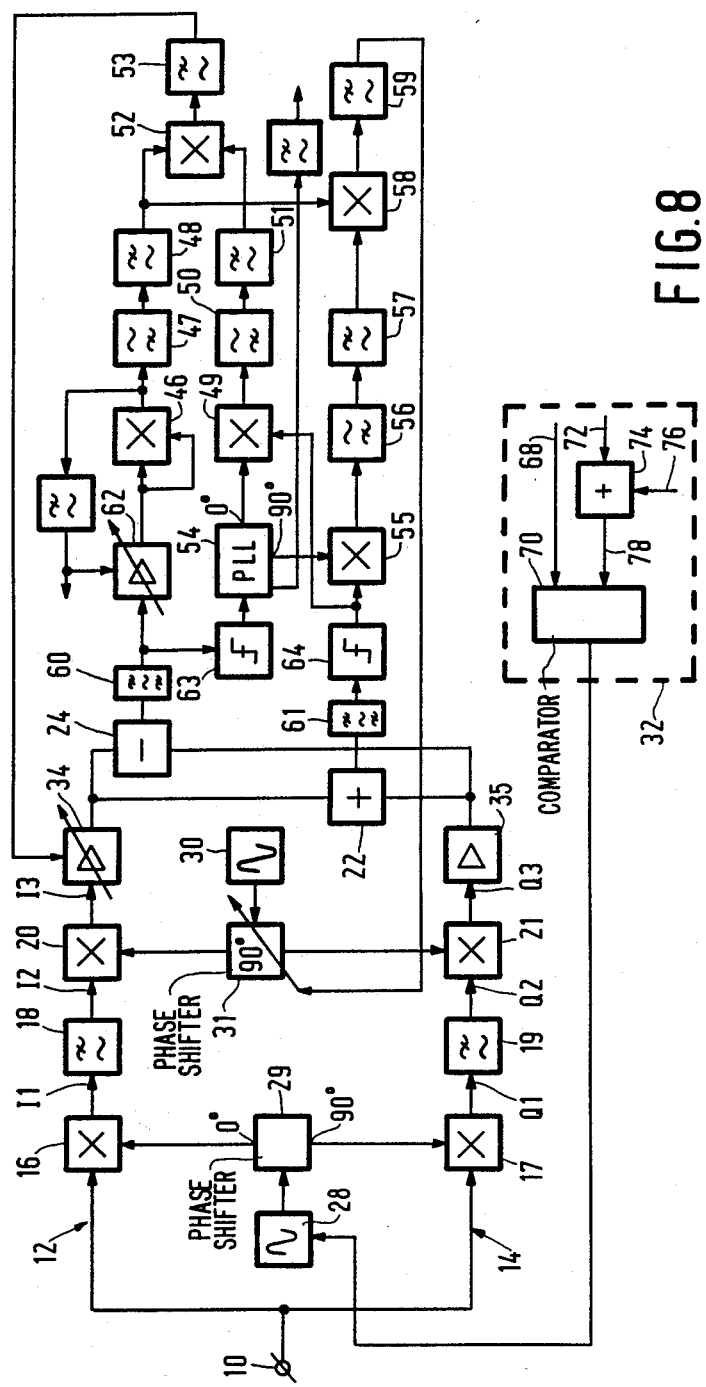
FIG. 8 is a block schematic diagram of a substantially complete dual branch receiver made in accordance with the present invention.

FIG. 8 illustrates a complete receiver made in accordance with the present invention, which receiver has means for deriving control signals for correcting gain and phase deviations.

The first and second branches 12, 14 are as described with reference to FIG. 4. The first local oscillator 28 is shown connected to a 90° phase shifter 29 having quadrature outputs. The second local oscillator 30 is shown connected to an adjustable phase shifter 31 which is responsive to a control signal to vary the relative phase of its outputs to compensate for phase deviations. An adjustable gain amplifier 34 is connected in the first branch 12 at the output of the third mixer 20 and a fixed gain amplifier 35 is connected in the second branch 14 at the output of the fourth mixer 21. The adjustable gain amplifier 34 is responsive to a control signal to equalise the gain in the branch 12 with that of the branch 14.

The image signal in either of the outputs of the summing circuit 22 (SUM) or the differencing circuit 24 (DIFF) could be used as a measure of the amplitude of deviations in gain and phase. For illustration the DIFF signal has been chosen for his purpose. The DIFF signal is bandpass filtered in a filter 60, has its amplitude adjusted, if required, in a variable gain amplifier 62 and is self-multiplied with itself in a first multiplier 46. D.C. signals produced by the self-multiplication are blocked by a high pass filter 47 while signals centerd at $2.fl_2$ are filtered away by a low pass filter 48. In practice the filters 47, 48 are realised as a capacitance-resistance (CR) high pass network and as a resistance-capacitance (RC) low pass network, respectively. The filtered product of the self-multiplied DIFF signal includes a signal centred at 2fo which is used for deriving the necessary control signals.

A second, contemporaneous operation comprises multiplying the DIFF signal by the SUM signal in a second multiplier 49. For this purpose the bandpass filtered DIFF signal is shaped in a limiter 63 and applied via the in-phase output of a broadband phase locked loop 54 to one input of the second muliplier 49. The SUM signal is bandpass filtered in a filter 61, shaped in a limiter 64 and is applied to a second input of the second multiplier 49. D.C. signals produced by the multiplication in the multiplier 49 are blocked by a second high pass filter 50 while signals centred at $2.fl_2$ are filtered away by a second low pass filter 51 to leave signals centred at 2fo.

The signals centred at 2fo in the outputs of the filters 48, 51 are multiplied together in another multiplier 52 and the product is low pass filtered in a filter 53 to provide a d.c. signal which is applied to the amplifier 34 as a gain control signal.

Phase control is applied by shifting the phase of either the DIFF or SUM signal by 90° (in the illustrated example the DIFF signal is phase shifted) and is multiplied by the other signal. The 90° output of the phase locked loop 54 provides the 90° phase shifted DIFF signal at one input of a third multiplier 55, the other input of which is connected to receive the waveform shaped SUM signal. The product is filtered in a third high pass filter 56 and then in a third low pass filter 57 again to provide signals centred at 2fo. The outputs of the low pass filters 48, 57 are multiplied in a further multiplier 58 and the output is low pass filtered in a filter 59 to provide a d.c. phase control signal which is applied to the phase shifter 31.

The source 32 of wobbling signals is arranged to act on the first local oscillator 28 which in the illustrated embodiment is implemented as a voltage controlled oscillator connected to a 90° phase shifter 29. An automatic frequency control of the first local oscillator is necessary to maintain a certain accuracy in the specified offset frequency fo. In practice, the value of fo is normally governed by a d.c. reference signal. In order to wobble fo, it is only necessary to introduce the wobbling signal in addition to this d.c. reference signal. The combined signal is then used to control automatically the frequency of the first local oscillator 28.

In order to implement this automatic frequency control, the output from an offset frequency detector, such as the output of a frequency discriminator in the PLL 54, is applied to one input 68 of a comparator 70. A d.c. reference signal to provide for the nominal offset frequency is applied to one input 72 of a summing circuit 74. A source of a wobbling signal (not shown) is applied to a second input 76 of the summing circuit 74. The summing circuit 74 has an output connected to a second input 78 of the comparator 70. The output from the comparator 70 comprises an afc signal for the first local oscillator 28.

In the event of the signal of the first local oscillator being synthesised from a frequency synthesised source then a nominal offset frequency can be built in. Additionally the wobbling signal can be introduced at a frequency or phase modulation part of the synthesizer, the output of which forms an input of a voltage controlled oscillator of the frequency synthesizer.

The source of wobbling signals may comprise a simple oscillator since its output signal can be of a low quality in terms of signal purity and accuracy in frequency. Alternatively it could be derived from the second local oscillator 30 by dividing its output frequency down using a frequency divider followed by an appropriate wave shaping network.

What is claimed is:

1. A dual branch receiver for an incoming signal having a carrier frequency, comprising:
   a signal input terminal coupled to first and second branches, the first branch including first and third mixers, the second branch including second and fourth mixers, said incoming signal being coupled to said first and second mixers, and said third and fourth mixers having outputs,
   a first local oscillator for producing a first local oscillator signal which is supplied to the first and second mixers for frequency down converting said incoming signal, the first local oscillator frequency being offset from said carrier frequency by a given offset frequency,
   a first 90° phase shifter for providing a quadrature phase relationship between one of the signals applied to the first mixer and the corresponding signal applied to the second mixer, whereby output signals from the first and second mixers are quadrature related signals, said quadrature related signals being coupled respectively to the third and fourth mixers,
   a second local oscillator for producing a second local oscillator signal which is applied in quadrature to the third and fourth mixers for frequency up converting said quadrature related signals,
   a summing circuit and a differencing circuit each having inputs coupled to said outputs of the third and fourth mixers, and
   a control signal arrangement receiving signals from at least one of said summing and differencing circuits for generating respective control signals for correcting undesired differences in signal processing in said first and second branches,
   characterized in that said receiver further comprises means for frequency modulating the first local oscillator signal with a wobbling frequency less than said given offset frequency, whereby distortion in output signals from said summing circuit and said differencing circuit is minimized when said incoming signal includes modulation components having frequencies related to said given offset frequency.

2. A receiver as claimed in claim 1, characterised in that the wobbling signal is a sinusoidal signal having a frequency of the order of 20 Hz with a deviation of the order of 100 Hz.

3. A receiver as claimed in claim 1, characterised in that the wobbling signal is a triangular signal or aramping signal.

4. A receiver as claimed in claim 3, characterised in that the first local oscillator is a voltage controlled oscillator having a frequency control input, and wherein the frequency modulating means includes means for applying a wobbling signal voltage to a d.c. frequency control voltage applied to the frequency control input of the voltage controlled oscillator.

5. A receiver as claimed in claim 3, characterised in that the first local oscillator is a frequency synthesizer, and in that a wobbling signal is introduced at a frequency or phase modulation part of the synthesizer, the output of which part forms an input of a voltage controlled oscillator of the frequency synthesizer.

6. A receiver as claimed in claim 5, further comprising automatic gain control means and automatic phase control means for compensating for gain and phase differences resulting from transmission differences in the first and second branches.

7. A receiver as claimed in claim 6, characterised in that the automatic gain control means comprises a first multiplier having two inputs both of which are coupled to the output of the differencing or summing circuit, a first high pass filter connected to the output of the first multiplier, a first low pass filter connected to an output of the first high pass filter, a second multiplier having a first input coupled to the output of the differencing circuit and a second input coupled to the output of the summing circuit, a second high pass filter connected to the output of the second multiplier, a second low pass filter connected to an output of the second high pass filter, a third multiplier having inputs connected respectively to outputs of the first and second low pass filters, and another low pass filter connected to an output of the third multiplier to provide an automatic gain control signal.

8. A receiver as claimed in claim 7, characterised in that the automatic phase control means comprises a fourth multiplier having first and second inputs and an output, a 90° phase shifter connected to the first input, an output of either the differencing circuit or the summing circuit being coupled to the phase shifter, an output of either summing circuit or the differencing circuit being coupled to the second input, a third high pass filter connected to the output of the fourth multiplier, a third low pass filter connected to the output of the third high pass filter, a fifth multiplier having inputs connected respectively to outputs of the first and third low pass filters, a further low pass filter connected to an output of the fifth multiplier and having an output coupled to another phase shifter connected to the output of the second local oscillator.

9. A receiver as claimed in claim 8, wherein the 90° phase shifter comprises a broadband phase locked loop.

10. A receiver as claimed in claim 1, further comprising automatic gain control means and automatic phase control means for compensating for gain and phase differences resulting from transmission differences in the first and second branches.

11. A receiver as claimed in claim 10, chracterised in that the automatic gain control means comprises a first multiplier having two inputs both of which are coupled to the output of the differencing or summing circuit, a first high pass filter connected to the output of the first multiplier, a first low pass filter connected to an output of the first high pass filter, a second multiplier having a first input coupled to the output of the differencing circuit and a second input coupled to the output of the summing circuit, a second high pass filter connected to the utput of the second multiplier, a second low pass filter connected to an output of the second high pass filter, a third multiplier having inputs connected respectively to outputs of the first and second low pass filters, and another low pass filter connected to an output of the third multiplier to provide an automatic gain control signal.

12. A receiver as claimed in claim 11, characterised in that the automatic phase control means comprises a fourth multiplier having first and second inputs and an output, a 90° phase shifter connected to the first input, an output of either the differencing circuit or the summing circuit being coupled to the phase shifter, an output of either summing circuit or the differencing circuit being coupled to the second input, a third high pass filter connected to the output of the fourth multiplier, a third low pass filter connected to the output of the third high pass filter, a fifth multiplier having inputs connected respectively to outputs of the first and third low pass filters, a further low pass filter connected to an output of the fifth multiplier and having an output coupled to another phase shifter connected to the output of the second local oscillator.

13. A receiver as claimed in claim 1, characterised in that the first local oscillator is a frequency synthesizer, and in that a wobbling signal is introduced at a frequency or phase modulation part of the synthesizer, the output of which part forms an input of a voltage controlled oscillator of the frequency synthesizer.

14. A receiver as claimed in claim 13, further comprising automatic gain control means and automatic phase control means for compensating for gain and phase differences resulting from transmission differences in the first and second branches.

15. A receiver as claimed in claim 1, characterised in that the first local oscillator is a voltage controlled oscillator having a frequency control input, and wherein the frequency modulating means includes means for applying a wobbling signal voltage to a d.c. frequency control voltage applied to the frequency control input of the voltage controlled oscillator.

16. A receiver as claimed in claim 15, characterised in that the first local oscillator is a frequency synthesizer, and in that a wobbling signal is introduced at a frequency or phase modulation part ot the synthesizer, the output of which part forms an input of a voltage controlled oscillator of the frequency synthesizer.

17. A receiver as claimed in claim 16, further comprising automatic gain control means and automatic phase control means for compensating for gain and phase differences resulting from transmission differences in the first and second branches.

18. A dual branch receiver for an incoming signal having a carrier frequency, comprising:

a signal input terminal coupled to first and second branches, the first branch including first and third mixers, the second branch including second and fourth mixers, said incoming signal being coupled to said first and second mixers, and said third and fourth mixers having outputs, a first local oscillator for producing a first local oscillator signal which is supplied to the first and second mixers for frequency down converting said incoming signal, the first local oscillator frequency being offset from said carrier frequency by a given offset frequency, a first 90° phase shifter for providing a quadrature phase relationship between one of the signals applied to the first mixer and the corresponding signal applied to the second mixer, whereby output signals from the first and second mixers are quadrature related signals, said quadrature related signals being couupled respectively to the third and fourth mixers, a second local oscillator for producing a second local oscillator signal which is applied in quadrature to the third and fourth mixers for frequency up converting said quadrature related signals, a summing circuit and a differencing circuit each having inputs coupled to said outputs of the third and fourth mixers, and a control signal arrangement receiving signals from at least one of said summing and differencing circuits for generating respective control signals for correcting undesired amplitude and phase differences in signal processing in said first and second branches, said arrangement including means for detecting an unwanted image signal component separated from the second local oscillator signal frequency by a value equal to the offset frequency, characterized in that said receiver further comprises means for frequency modulating the first local oscillator signal with a wobbling frequency less than said given offset frequency, said means for detecting thereby detecting said unwanted image signal component in the presence of frequency modulation of said incoming signal at a modulation frequency equal to said given offset frequency, whereby distortion in output signals from said summing circuit and said differencing circuit is minimized when said incoming signal is frequency modulated at a modulation frequency equal to said given offset frequency.

* * * * *